US011646753B2

United States Patent
Torbatian et al.

(10) Patent No.: US 11,646,753 B2
(45) Date of Patent: May 9, 2023

(54) METHODS AND APPARATUS FOR POWER EFFICIENT DESIGN OF FORWARD ERROR CORRECTION FOR OPTICAL COMMUNICATION SYSTEMS

(71) Applicant: Infinera Corp., Annapolis Junction, MD (US)

(72) Inventors: Mehdi Torbatian, Ottawa (CA); Alex Nicolescu, Ottawa (CA); Han Henry Sun, Ottawa (CA); Mohsen Tehrani, Ottawa (CA); Kuang-Tsan Wu, Ottawa (CA)

(73) Assignee: Infinera Corporation, San Jose, CA (US)

( * ) Notice: Subject to any disclaimer, the term of this patent is extended or adjusted under 35 U.S.C. 154(b) by 0 days.

(21) Appl. No.: 17/327,064

(22) Filed: May 21, 2021

(65) Prior Publication Data

US 2021/0367617 A1    Nov. 25, 2021

Related U.S. Application Data

(60) Provisional application No. 63/028,449, filed on May 21, 2020.

(51) Int. Cl.
*H03M 13/23* (2006.01)
*G06F 7/78* (2006.01)
(Continued)

(52) U.S. Cl.
CPC .......... *H03M 13/235* (2013.01); *G06F 7/582* (2013.01); *G06F 7/78* (2013.01); *H03M 13/11* (2013.01)

(58) Field of Classification Search
None
See application file for complete search history.

(56) References Cited

U.S. PATENT DOCUMENTS 4,849,976 A * 7/1989 Schilling ............... H03M 13/29
714/755
5,546,409 A   8/1996 Karasawa
(Continued)

FOREIGN PATENT DOCUMENTS

JP      7-262031    10/1995
JP    2013-198140    9/2013

OTHER PUBLICATIONS

Vincent Roca et al., "RS + LDPC-Staircase Codes for the Erasure Channel: Standards, Usage and Performance", 2013 IEEE 9th International Conference on Wireless and Mobile Computing, Networking and Communications, pp. 638-644.
(Continued)

*Primary Examiner* — Guerrier Merant
(74) *Attorney, Agent, or Firm* — David L. Soltz

(57) ABSTRACT

Consistent with a further aspect of the present disclosure, previously encoded data is stored in a memory, and an encoder accesses both input data and previously encoded data to generate new encoded data or a new codeword. Each codeword is stored in a row of the memory, and with each newly generated codeword, each previously stored code word is shifted to an adjacent row of the memory. In one example, the memory is delineated as a plurality of blocks including rows and columns of bits. When generating a new code word, randomly selected columns of bits in the memory are read from randomly selected blocks of the memory and supplied to the encoder. In this manner the number of times the memory is access is reduced and power consumption is reduced.

7 Claims, 13 Drawing Sheets

(51) Int. Cl.
*G06F 7/58* (2006.01)
*H03M 13/11* (2006.01)

(56) References Cited

U.S. PATENT DOCUMENTS

| | | | |
|---|---|---|---|
| 8,065,585 B1 * | 11/2011 | Abbaszadeh | H03M 13/2963 714/752 |
| 8,103,942 B2 | 1/2012 | Kuroishi et al. | |
| 8,271,846 B2 | 9/2012 | Myung et al. | |
| 8,276,047 B2 | 9/2012 | Coe | |
| 8,386,897 B1 | 2/2013 | Northcott | |
| 8,423,876 B2 | 4/2013 | Okamura et al. | |
| 10,201,026 B1 * | 2/2019 | Humblet | H04L 1/0071 |

OTHER PUBLICATIONS

R. Pyndiah, "Near-optimum decoding of product codes: block turbo codes," IEEE Transactions on Communications, vol. 46, No. 8, pp. 1003-1010, Aug. 1998.

G. Hu and J. Sha, "Tail-biting code: A modification to staircase code for high-speed networking," 2015 IEEE Workshop on Signal Processing Systems.

C. Hager, A. G. i. Amat, H. D. Pfister, A. Alvarado, F. Brannström and E. Agrell, "On parameter optimization for staircase codes," 2015 Optical Fiber Communications Conference and Exhibition (OFC), 2015, pp. 1-3.

Y. -Y. Jian, H. D. Pfister, K. R. Narayanan, Raghu Rao and R. Mazahreh, "Iterative hard-decision decoding of braided BCH codes for high-speed optical communication," 2013 IEEE Global Communications Conference (GLOBECOM), 2013, pp. 2376-2381.

A. G. i. Amat, C. Häger, F. Brännström and E. Agrell, "Spatially-coupled codes for optical communications: state-of-the-art and open problems," 2015 Opto-Electronics and Communications Conference (OECC), 2015, pp. 1-3.

C. Häger, H. D. Pfister, A. Graell i Amat and F. Brännström, "Deterministic and ensemble-based spatially-coupled product codes," 2016 IEEE International Symposium on Information Theory (ISIT), 2016, pp. 2114-2118.

Wei Zhang, M. Lentmaier, D. J. Costello and K. S. Zigangirov, "Braided convolutional codes," Proceedings. International Symposium on Information Theory, 2005.

A. J. Feltstrom, D. Truhachev, M. Lentmaier and K. S. Zigangirov, "Braided Block Codes," in IEEE Transactions on Information Theory, vol. 55, No. 6, pp. 2640-2658, Jun. 2009.

M. Lentmaier et al., "Density Evolution Analysis of Protograph-Based Braided Block Codes on the Erasure Channel," SCC 2010, Jan. 18-21, 2010, Siegen, Germany, Paper 33.

H. D. Pfister and K. R. Narayanan, "An introduction to spatially-coupled codes via practical examples," 2014 XXXIth URSI General Assembly and Scientific Symposium (URSI GASS), 2014, pp. 1-4.

H. D. Pfister, S. K. Emmadi and K. Narayanan, "Symmetric product codes," 2015 Information Theory and Applications Workshop (ITA), 2015, pp. 282-290.

Zhang, W., Lentmaier, M., Zigangirov, K., & Costello, D. J. . J. (2010). Braided Convolutional Codes: A New Class of Turbo-Like Codes. IEEE Transactions on Information Theory, 56(1), 316-331.

C. Häger, H. D. Pfister, A. G. Amat and F. Brännström, "Density evolution and error floor analysis for staircase and braided codes," 2016 Optical Fiber Communications Conference and Exhibition (OFC), 2016, pp. 1-3.

M. Scholten et al., "Enhanced FEC for 40G/100G," ECOC, Sep. 2009.

Study Group 15—CONTRIBUTION 0517, Cyclically Interleaved BCH 'Swizzle' FEC for B100G IrDI or MV-laDI, PMC-Sierra, Inc., International Telecommunications Union.

C. Häger, et al. "Density Evolution for Deterministic Generalized Product Codes with Higher-Order Modulation," International Symposium on Turbo Codes & Iterative Information Processing Brest, France, Sep. 6, 2016, Fiber-Optics Research Communications Center, Chalmers.

J. Yeon and H. Lee, "High-performance iterative BCH decoder architecture for 100 Gb/s optical communications," 2013 IEEE International Symposium on Circuits and Systems (ISCAS), 2013, pp. 1344-1347.

Everett, Jared S.. "Forward-Error Correction Coding for Underwater Free-Space Optical Communication." (2009), p. 105.

* cited by examiner

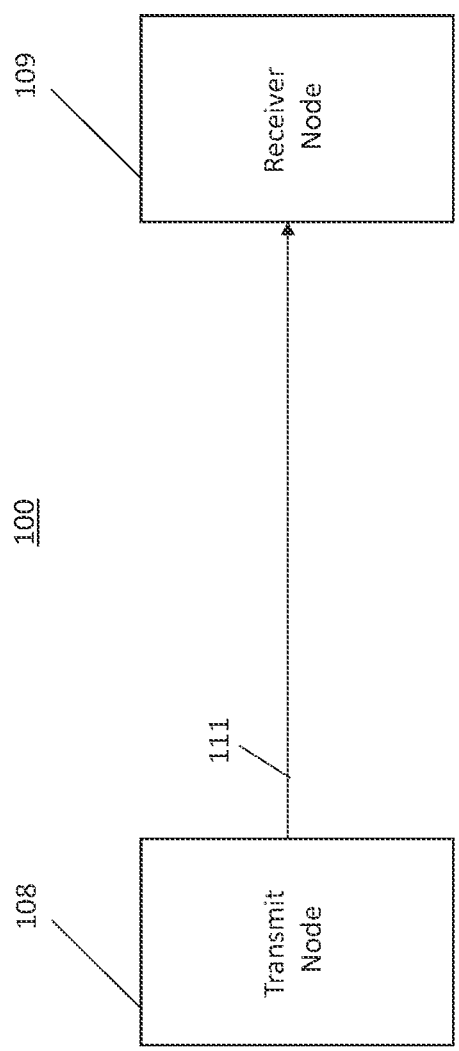

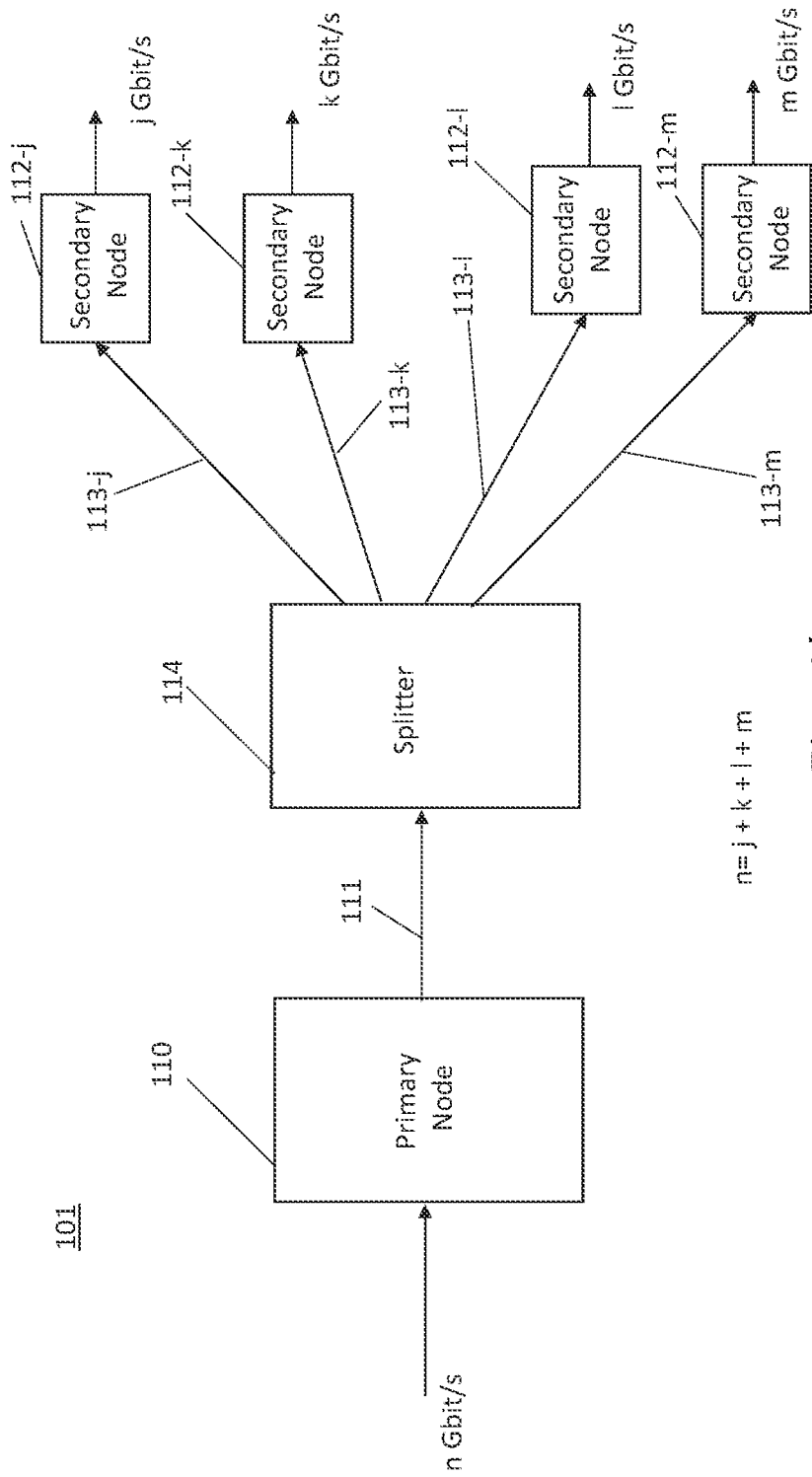

METHODS AND APPARATUS FOR POWER EFFICIENT DESIGN OF FORWARD ERROR CORRECTION FOR OPTICAL COMMUNICATION SYSTEMS

CROSS REFERENCE TO RELATED APPLICATIONS

This application claims the benefit under 35 U.S.C. § 119(e) to U.S. Provisional Application Ser. No. 63/028,449 filed on May 21, 2021, which is incorporated by reference herein in its entirety.

BACKGROUND

Forward error correction (FEC) is a way of reducing errors in transmission of data over unreliable and/or noisy communication channels. Optical communication systems, for example, use forward error correction to reduce transmission errors. Forward error correction involves encoding data for transmission over a communication channel by adding redundancy to the data. A forward error correction technique may involve: (1) receiving data bits for transmission over a communication channel; (2) encoding the data bits by using an error correcting code to generate parity bits from the data bits; and (3) transmitting both the data bits and the parity bits over the communication channel. Since the parity bits are generated from the data bits, transmission of the data bits and parity bits together provides a degree of redundancy in the transmitted information, which in turn allows for recovery from errors that may occur during transmission.

Previously, "error free transmission" was equated with a bit error rate of about 1e-15. Recent advancements in optical communication systems, however, have enabled data rates as high as 800 giga bits per second per wavelength. At such rates, and with a bit error rate of 1e-15, one bit error may occur every 20 minutes on average, which may be unacceptable in many applications. Accordingly, stronger FEC with a low error floor may be required to guarantee a stable and reliable connection over a reasonable time interval.

Moreover, error correction code performance is often determined based on to what extent the code facilitates data rates approximating the Shannon Limit over a linear additive white Gaussian (AWGN) channel or fiber and thus maximizes signal reach. Although fiber optic links are considered a non-linear communication medium, for purposes of evaluating error correction codes, all linear and non-linear impairments are assumed to be equalized or compensated before the data sequence carried by a signal reaches the FEC decoder.

In addition to the above two performance metrics, low FEC power consumption is often a desirable feature, because FEC may consume a significant of power in coherent transmission chips.

Achieving low power consumption and good performance is often difficult to achieve.

SUMMARY

Consistent with an aspect of the present disclosure, a forward error correction encoder is provided that comprises a memory. A first portion of the memory being delineated to include a plurality of blocks, such that each of the plurality of blocks includes a plurality of columns of first bits, and a second portion of the memory includes a plurality of rows. Each of the plurality of rows includes second bits. In addition, the forward error correction encoder includes an encoder circuit operable to generate parity bits based on selected ones of the first bits, selected ones of the second bits, and input data bits supplied to the forward error correction encoder, wherein the selected ones of the first bits are stored in randomly selected ones of the plurality of columns, the randomly selected one of the plurality of columns being within randomly selected ones of the plurality of blocks.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) and together with the description, serve to explain the principles of the invention.

BRIEF DESCRIPTION OF THE DRAWINGS

FIG. 1a illustrates a block diagram of an optical communication system consistent with an aspect of the present disclosure;

FIG. 1b illustrates a block diagram of an alternative optical communication system consistent with a further aspect of the present disclosure;

DESCRIPTION OF THE EMBODIMENTS

Figure 2A:
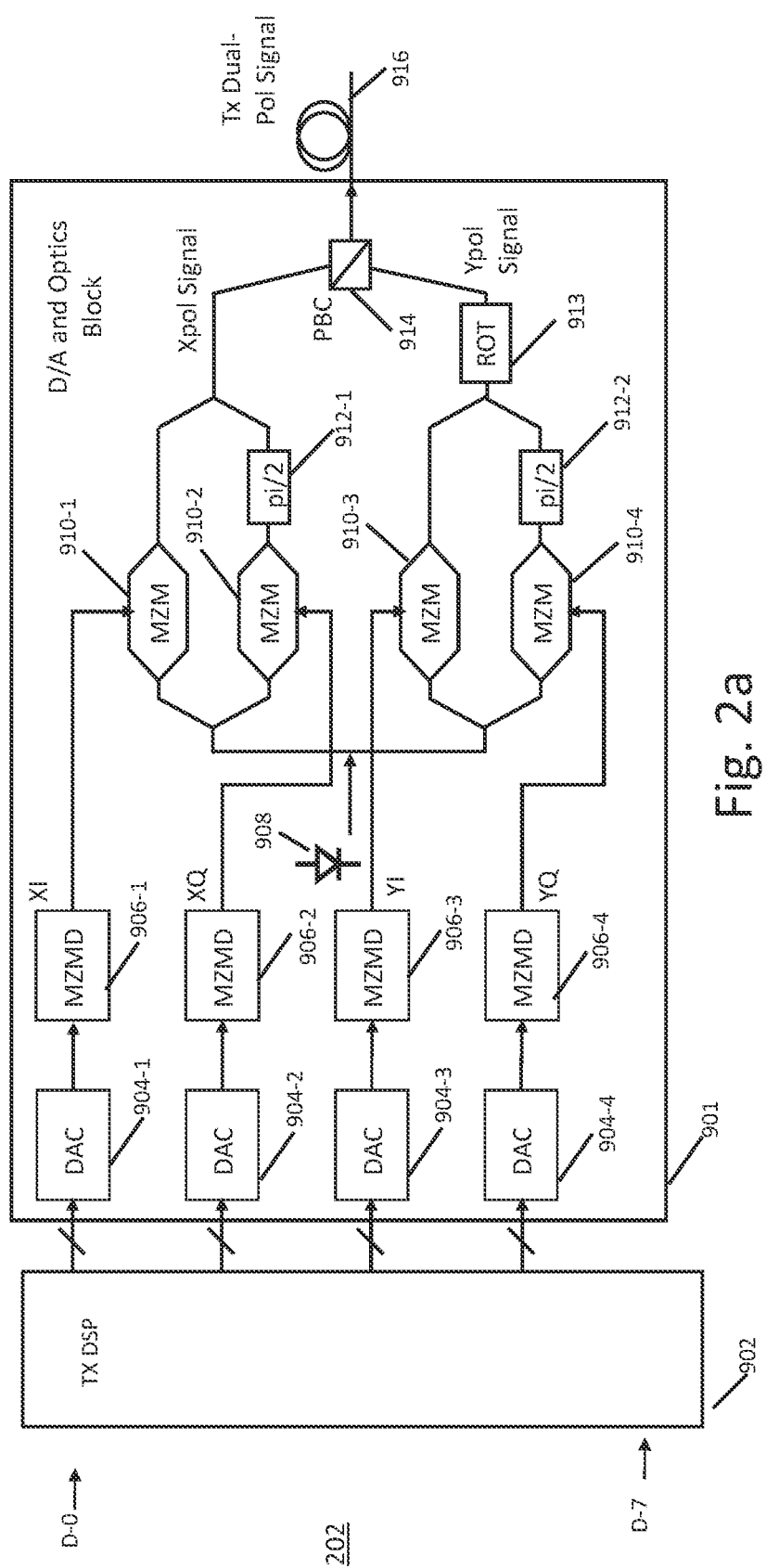
FIG. 2a illustrates an example of a transmitter consistent with an aspect of the present disclosure.
Figure 2B:
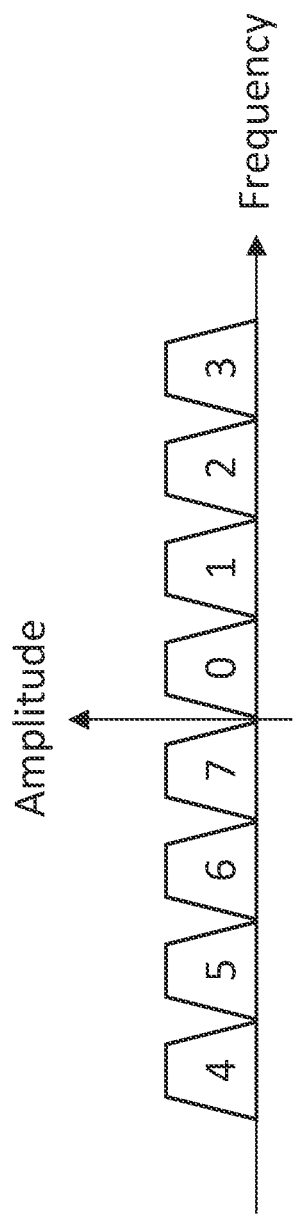
FIG. 2b shows an example of a power spectral density plots representing optical subcarriers consistent with a further aspect of the present disclosure.

Consistent with an aspect of the present disclosure, an error correction code having, among other things, features of a generalized product codes (GPC) is provided to achieve good performance but with reasonable complexity. A lower bound of the minimum hamming distance of the code disclosed herein facilitates an easier code design to achieve a desired error floor level. Iterative decoding may be employed in a convolutional format to provide improved threshold performance close to the Shannon Limit. The decoder may also be made less complex as optimal or threshold performance is typically obtained within a few iterations.

Consistent with a further aspect of the present disclosure, previously encoded data is stored in a memory, and an encoder accesses both input data and previously encoded data to generate new encoded data or a new codeword. Each codeword is stored in a row of the memory, and with each newly generated codeword, each previously stored code word is shifted to an adjacent row of the memory. In one example, the memory is delineated as a plurality of blocks including rows and columns of bits. When generating a new code word, randomly selected columns of bits in the memory are read from randomly selected blocks of the memory and supplied to the encoder. In this manner the number of times the memory is accessed is reduced and power consumption is reduced.

Reference will now be made in detail to the present embodiment(s) (exemplary embodiments) of the present disclosure, an example(s) of which is (are) illustrated in the accompanying drawings. Wherever possible, the same reference numbers will be used throughout the drawings to refer to the same or like parts.

Before discussing an encoder and memory consistent with the present disclosure, an example of an optical communication system in which such encoder and memory may be employed will next be described with reference to FIGS. 1a, 1b, 2a, 2b, and FIG. 3.

FIG. 1a is a block diagram of an illustrative optical communication system 100 in which some embodiments of the technology described herein may operate. Optical communication system 100 may be configured to transmit data at a high-speed. For example, optical communication system 100 may be configured to transfer data at rates of up to 100 Gb/s, 200 Gb/s, 400 Gb/s, 600 Gb/s, 800 Gbs, 1 Tb/s, 2 Tb/s, 5 Tb/s, 10 Tb/s or any rate between 100 Gb/s and 10 Tb/s, in some embodiments.

Optical communication system 100 comprises a transmit node 108 configured to: (1) receive data for transmission; (2) use forward error correction to encode the data to obtain encoded data; and (3) transmit the encoded data (e.g., by using an appropriate modulation scheme) over optical communication path 111. Transmit node 108 may perform forward error correction coding in any suitable way and, in some embodiments, may perform forward error correction in accordance with some embodiments of the technology described herein.

Optical communication system 100 further comprises a receiver 109 configured to: (1) receive data over optical communication path 111 (e.g., at least in part by demodulating the transmitted data); (2) decode the encoded data to obtain data; and (3) output the decoded data.

FIG. 1b illustrates an example of an aggregation network 101 consistent with the present disclosure in which primary node 110 may communicate with multiple secondary nodes 112-j to 112-m, which sometimes may be referred to individually or collectively as secondary node(s) 112. Secondary nodes 112, in one example, are remote from primary node 110. Primary node 110 may transmit optical subcarriers, described in greater detail below, in a downstream direction onto an optical communication path 111, which, like each of optical communication paths 113-j to 113-m, may include one or more segments of optical fiber, as well as one or more optical amplifiers, reconfigurable add-drop multiplexers (ROADMs) or other optical fiber communication equipment. Splitter 114 may be coupled to an end of optical communication path 111 to receive the optical subcarriers and provide a power split portion of each subcarrier to a corresponding one of secondary nodes 112-j to 112-m via a respective one of optical communication paths 113-j to 113-m.

As further shown in FIG. 1b, primary node 110 has a data capacity to receive n Gbit/s of data (e.g., a data stream) for transmission to secondary node 112. Each secondary node 112 may receive and output to a user or customer a portion of the data input to primary node 110. In this example, secondary nodes 112-j, 112-k, 112-l, and 112-m output j Gbit/s, k Gbit/s, l Gbit/s, and m Gbit/s of data (data streams), respectively, whereby the sum of the j, k, l, and m may equal n (where j, k, l, m, and n are positive numbers).

FIG. 2a illustrates transmitter 202, which may be provided in transmit node 108 or primary node 110 to provide optical signals to one or more receivers as noted above. Transmitter 202 includes a transmitter DSP (TX DSP) 902 and a D/A and optics block 901. DSP 902 receives, in this example, input data streams D0 to D7, although few or more input data streams may be provided. Based on the input data streams, DSP 902 may supply a plurality of outputs to D/A and optics block 901 including digital-to-analog conversion (DAC) circuits 904-1 to 904-4, which convert digital signal received from DSP 902 into corresponding analog signals. D/A and optics block 901 also includes driver circuits 906-1 to 906-2 that receive the analog signals from DACs 904-1 to 904-4 and adjust the voltages or other characteristics thereof to provide drive signals to a corresponding one of modulators 910-1 to 910-4.

D/A and optics block 901 further includes modulators 910-1 to 910-4, each of which may be, for example, a Mach-Zehnder modulator (MZM) that modulates the phase and/or amplitude of the light output from laser 908. As further shown in FIG. 2a, light output from laser 908, also included in block 901, is split such that a first portion of the light is supplied to a first MZM pairing, including MZMs 910-1 and 910-2, and a second portion of the light is supplied to a second MZM pairing, including MZMs 910-3 and 910-4. The first portion of the light is split further into third and fourth portions, such that the third portion is modulated by MZM 910-1 to provide an in-phase (I) component of an X (or TE) polarization component of a modulated optical signal, and the fourth portion is modulated by MZM 910-2 and fed to phase shifter 912-1 to shift the phase of such light by 90 degrees in order to provide a quadrature (Q) component of the X polarization component of the modulated optical signal. Similarly, the second portion of the light is further split into fifth and sixth portions, such that the fifth portion is modulated by MZM 910-3 to provide an in-phase (I) component of a Y (or TM) polarization component of the modulated optical signal, and the sixth portion is modulated by MZM 910-4 and fed to phase shifter 912-2 to shift the phase of such light by 90 degrees to provide a quadrature (Q) component of the Y polarization component of the modulated optical signal.

The optical outputs of MZMs 910-1 and 910-2 are combined to provide an X polarized optical signal including I and Q components and are fed to a polarization beam combiner (PBC) 914 provided in block 901. In addition, the outputs of MZMs 910-3 and 910-4 are combined to provide an optical signal that is fed to polarization rotator 913, further provided in block 901, that rotates the polarization of such optical signal to provide a modulated optical signal having a Y (or TM) polarization. The Y polarized modulated optical signal also is provided to PBC 914, which combines the X and Y polarized modulated optical signals to provide a polarization multiplexed ("dual-pol") modulated optical signal onto optical fiber 916, for example, which may be included as a segment of optical fiber in optical communication path 111.

In one example, the polarization multiplexed optical signal output from D/A and optics block 401 includes subcarriers SC0-SC07 (see FIG. 2b), such that each subcarrier has X and Y polarization components and I and Q components. Moreover, each subcarrier SC0 to SC7 may be associated with or corresponds to a respective one of DSP inputs D0 to D7. Each optical subcarrier may be a Nyquist subcarrier, which are a group of optical signals, each carrying data, wherein (i) the spectrum of each such optical signal within the group is sufficiently non-overlapping such that the optical signals remain distinguishable from each other in the frequency domain, and (ii) such group of optical signals is generated by modulation of light from a single laser. In general, each subcarrier may have an optical spectral bandwidth that is at least equal to the Nyquist frequency, as determined by the baud rate of such subcarrier.

Figure 3:
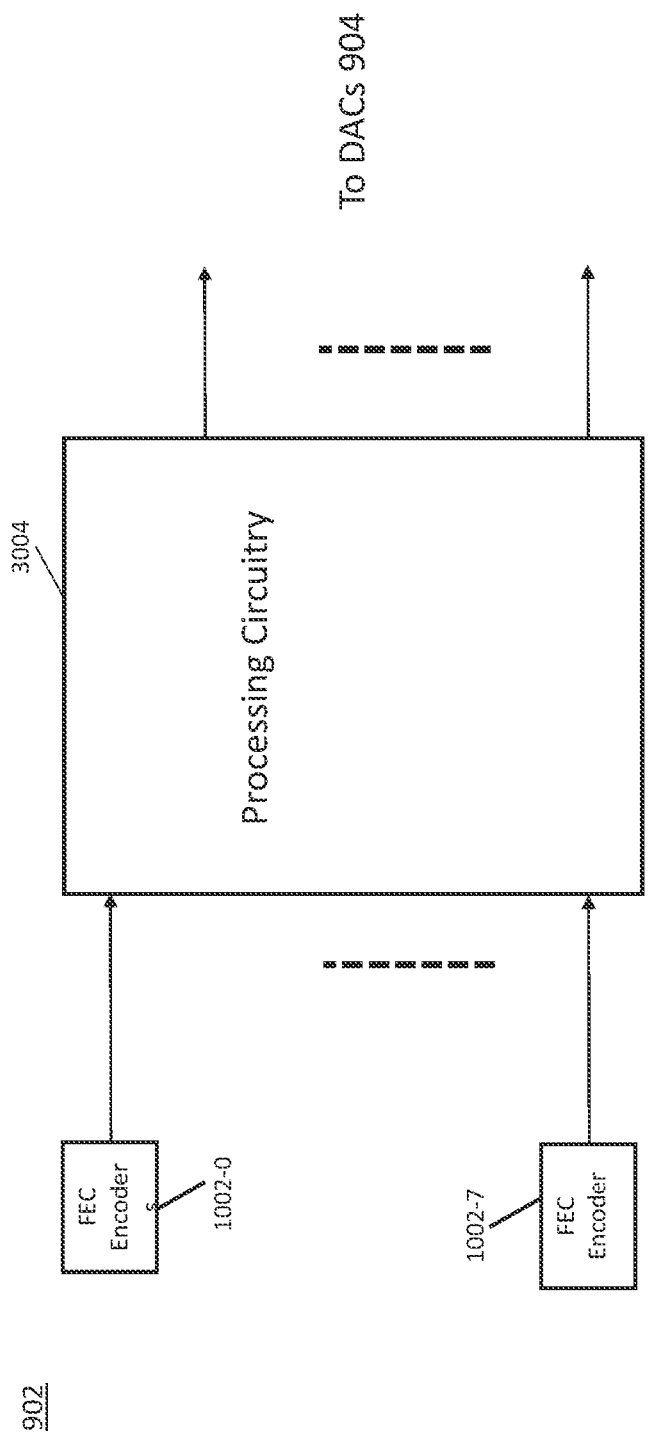
FIG. 3 is a block diagram of digital signal processor consistent with the present disclosure.

FIG. 3 shows DSP 902 in greater detail. DSP 902, in one example, includes a plurality of FEC encoders 1002-0 to 1002-7, each of which receiving a corresponding one of input data streams D0 to D7. Each of FEC encoders 1002-0 to 1002-7 may encode the received data streams based on technology disclosed herein to provide encoded data to processing circuitry 3004, which, in turn provides outputs to DACs 904. Each optical subcarrier, SC0 to SC7 carries data indicative of the encoded outputs from FEC encoders 1002-0 to 1002-7.

FEC encoding consistent with an aspect of the present disclosure will next be described with reference to FIGS. 4-11.

Figure 4:
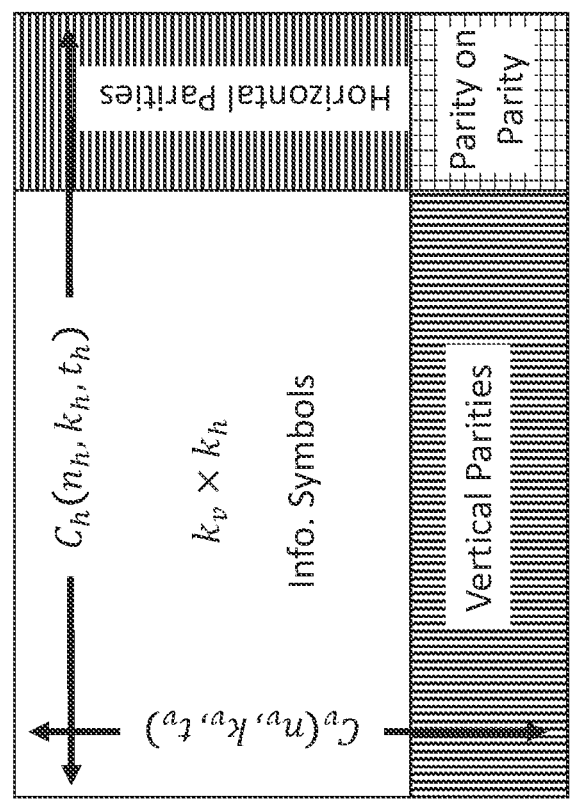
FIG. 4 is a diagram of a linear block code.
Figure 5:
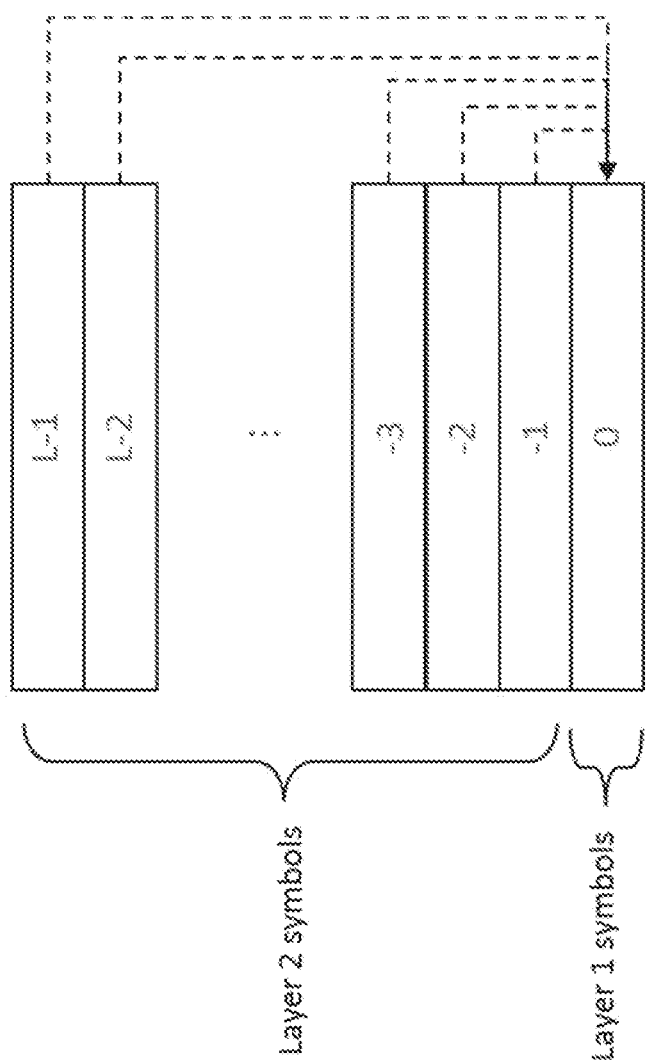
FIG. 5 shows an example of Layer 1 and Layer 2 symbols consistent with an aspect of the present disclosure.

Consider a linear block code C(n, k, t), with n, k, and t parameters, as shown in FIG. 4, which illustrates a general structure of a product code. n is the codeword's length, k length of the input sequence of symbols, and d is the minimum hamming distance of the code. A product code (PC) comprises of two linear component block codes $C_v(n_v, k_v, t_v)$, and $C_h(n_h, k_h, t_h)$ which protect a block of information symbols of size $k_v \times k_h$ in both vertical and horizontal directions. $C_v$ is first applied on every column of the information block to construct an extended block of symbols of size $n_v \times k_h$. Then $C_h$ is applied to every row of the new block to construct the final codeword of the PC of size $n_v \times n_h$ symbols. Horizontal encoding may be applied first followed by the vertical encoding. There will be no difference in the results. In one example, the same component code may be used for both vertical and horizontal directions. In one example, the minimum hamming distance of the resulting product code (PC) is equal to the product of the hamming minimum distances of the two component codes $d_{min} = d_v \times d_h$.

Turbo product codes (TPC) (or block turbo codes (BTC)) are a trivial extension of PCs when iterative decoding of rows and columns is applied. TPCs are one of the major categories of codes that have been used in coherent optic communications.

Braided block codes are perhaps the first extension of PCs to convolutional structures by spatial coupling of consecutive blocks/codewords while the main characteristics of PC are preserved. This may improve performance and increase the minimum hamming distance beyond what is achievable by other PCs. Moreover, they enable design of different interleavers between the two component codewords. The interleaver gain helps to improve the threshold performance and to further tighten the gap to Shannon limit.

In regard to continuously interleaved BCH (CI-BCH) codes, half the symbols of the output codeword plays constitute the vertical codeword, and the horizontal symbols constitute the remaining symbols of the output codeword. CI-BCH codes will next be described with reference to FIG. 5.

Figure 6:
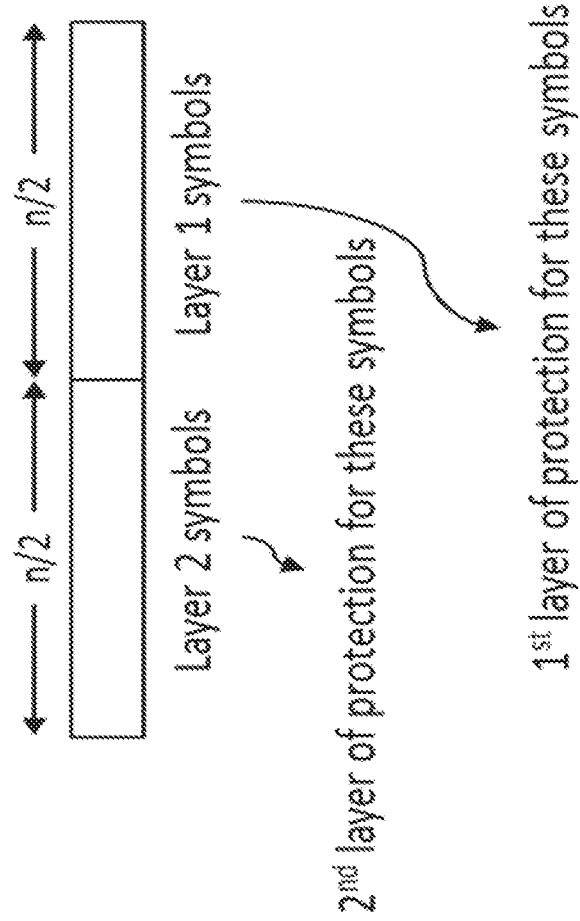
FIG. 6 shows another example of Layer 1 and Layer 2 symbols consistent with a further aspect of the present disclosure.

Assume 0 is the current clock cycle, −1 represents one clock cycle earlier, and −2 represents the clock cycle before −1. For a codeword in clock cycle 0, half of the symbols come from the same clock cycle, while the other half come from encoded symbols from earlier clock cycles. Thus, each component codeword comprises of two parts. The first part coming from the storage, consists of symbols that are already encoded one time (from clock cycles −1 to −(L−1)), and thus the current codeword is the second Layer of protection for them. We call these "Layer 2" symbols. The second part of each codeword comprises of new information symbols and the generated parities. We call this part "Layer 1" symbols as they only have been protected one time till encoding of the current codeword. The Layer 1 symbols are stored in the memory after the encoding procedure is completed as encoded symbols in clock cycle 0. They will be used in later clock cycles as Layer 2 symbols. FIG. 6 illustrates the structure of a codeword of the family of CI-BCH codes.

Consistent with the present disclosure, interleaving between Layer 1 and Layer 2 symbols is designed to minimize the complexity of a hardware implementation specifically to facilitate reading to and writing from external memories, for example.

In the code structure disclosed herein, each bit is protected by two component codewords, and the encoding taking place in the encoder is based on a generalized convolutional product (GCPC) code. The component codes can be any linear block code such as codes from the family of Bose-Chaudhuri-Hocquenghem (BCH) codes. The intersection of any two component codewords is at most one bit to guarantee minimum performance measures like that of TPC codes. Each component codeword comprises of two parts. The first part comes from memory from symbols that have been encoded and thus the current codeword is the second Layer of protection for them, "Layer 2" symbols. The second part of each codeword includes new information symbols and the generated parities, "Layer 1" symbols. The Layer 1 symbols may then be stored in the memory after the encoding procedure is completed. In one example, the following criteria may be implemented:

(1) The intersection of two codewords is at most one symbol. Thus, each symbol in Layer 2 of a codeword should come from a distinct codeword already stored in the memory. If Layer 1 symbols are stored in the memory row-wise, Layer 2 symbols should be read from the memory in a way that maximum one symbol from each row is read. For example, by reading bits column-wise from memory, each individual symbol of Layer 2 is from a different Layer 1 symbol sequence.

(2) Every symbol is protected by only two different codewords. Accordingly, each symbol should appear only once as a Layer 1 symbol in a codeword, and it should appear only once as a Layer two symbol in another codeword which has no other symbol in common with the first codeword.

In another example, a multiplicity of error patterns with minimum hamming weight may be minimized.

Consistent with a further aspect of the present disclosure, an architecture is provided that simplifies the storage structure or memory feeding data to the encoder and minimizes the data access rate to such memory.

Consider a code with rate R and overhead equal to (1/R−1), and an arbitrary linear block component code C(n, k, d) with d the minimum hamming distance of the code. If half of the encoded symbols per codeword are taken from memory (Layer 2 symbols), the code rate and the overhead percentage are calculated as follows $$R = \frac{k - n/2}{n/2}, OH = \frac{n-k}{k - n/2} * 100$$

Figure 7:
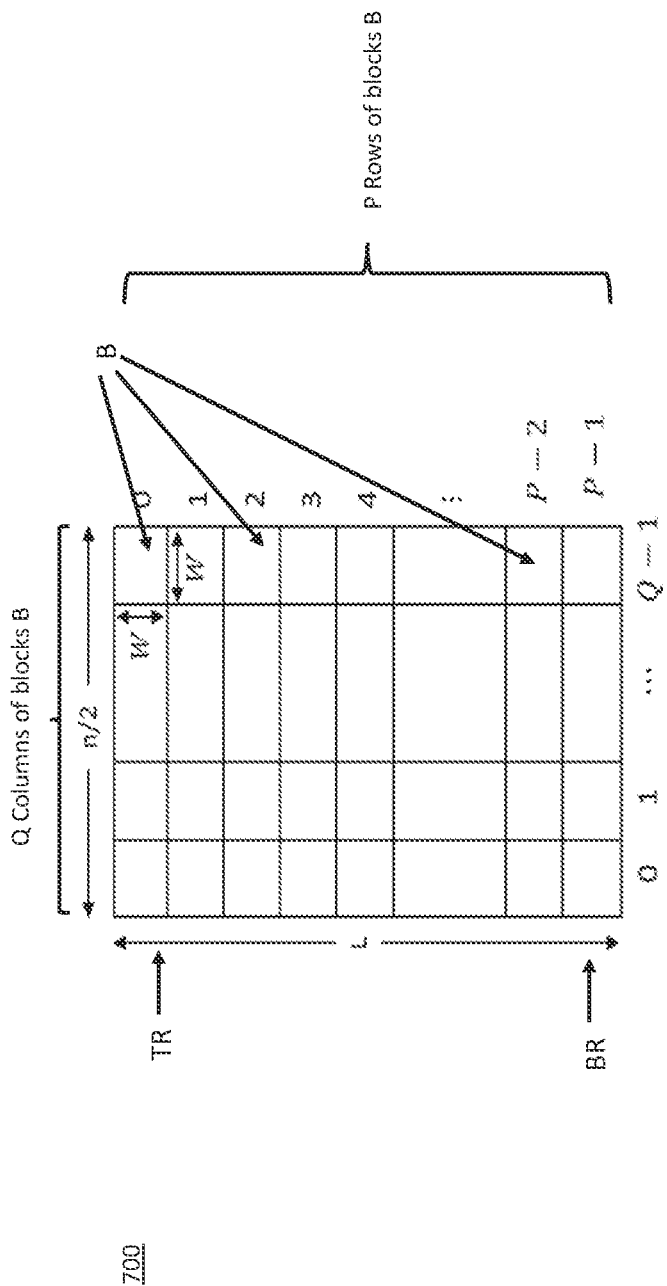
FIGS. 7-9 show examples of memories consistent with an additional aspect of the present disclosure.
Figure 8:
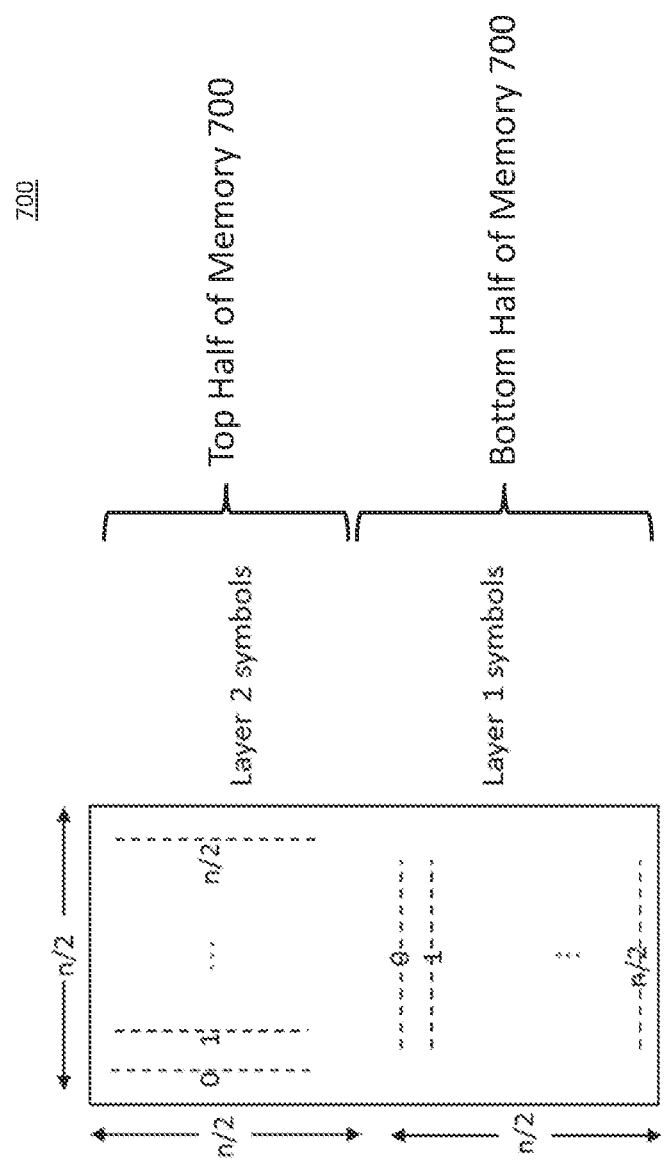

As shown in FIG. 7, a storage structure or memory 700 is provided having a size sufficient to store L×(n/2) symbols. L is the memory length of the code, such that the span of the previously encoded codewords involving in encoding of the current codeword. L>n/2 to satisfy the requirements of the interleaver design. n is the codeword length in symbols, and n/2 is the width of the storage structure or memory to store Layer 1 symbols of a codeword. The memory may be delineated into P(rows)×Q(columns) quadrants or blocks B, each of which having a size W×W symbols, such that the width and the length of each block, in this example, is W symbols. Thus, n/2=Q×W, and L=P×W.

Each row of memory 700 may include W×n/2 symbols and is associated with W component codewords that is processed in one clock cycle. In each clock cycle, new data symbols required for encoding W component codewords are received from the input sequence or stream, such as D0 and are paired with W×(n/2) Layer 2 symbols.

Selection of Layer 1 and Layer 2 symbols consistent with the present disclosure will next be described. Let c represents a random permutation of numbers from 0 to W−1. c(i), i=0, . . . , W−1, is the i-th entry of c. For codeword i, i=0, . . . , W−1, the following steps may be carried out:

Step 1: A random selection of Q distinct numbers in the range 0 to P−2 may be selected. These numbers will be used as a row index of the final selected quadrants or blocks.

Step 2: A random permutation of numbers 0, . . . , Q−1 is then selected. These numbers will be used as the column index of the final selected quadrants.

Step 3: The numbers in the first random set, and the numbers in the second random set are paired randomly to provide Q pairs of random numbers indicating the Cartesian coordinates of Q random quadrants or blocks B in the P×Q quadrant storage structure.

Step 4: Columns c(i), of length W symbols, of the Q selected quadrants may then be selected and concatenated to form Layer 2 symbols.

Step 5: Layer 2 symbols and new symbols coming from the input sequence are fed to the encoder circuit to generate parity symbols. New symbols plus the generated parities form Layer 1 symbols are stored into memory 700 (see FIG. 7) as the i-th row of the row-block P−1.

Although the random set number in step 1 are in the range 0 to P−2, the Layer 2 symbols may be selected from a smaller set to force a minimum fixed distance between Layer 1 and Layer 2 symbols. This can be done by choosing Layer 2 symbols from the top X (X<P−2) row (TR) block of the memory 700 while Layer 1 symbols are placed in the bottom row (BR) block (P−1) of memory 700. In this case, there will be P−X row block gap between Layer 1 and Layer 2 symbols.

Memory 700 is implemented, in one example, in a wrap-around manner, and the position of Layer 1 and Layer 2 symbols are tracked using read and write pointers. This is performed to avoid shifting all symbols of the storage structure in one direction every clock cycle which consumes more power.

The following examples are illustrative of concepts of the present disclosure.

Example 1: Assume Q=1, P=2, L=n, and W=n/2. Each row i, i=L/2, . . . L−1 as Layer 1 symbols is paired with one column j=0, . . . n−1 of the top half of memory 700. See FIG. 8.

Figure 9:
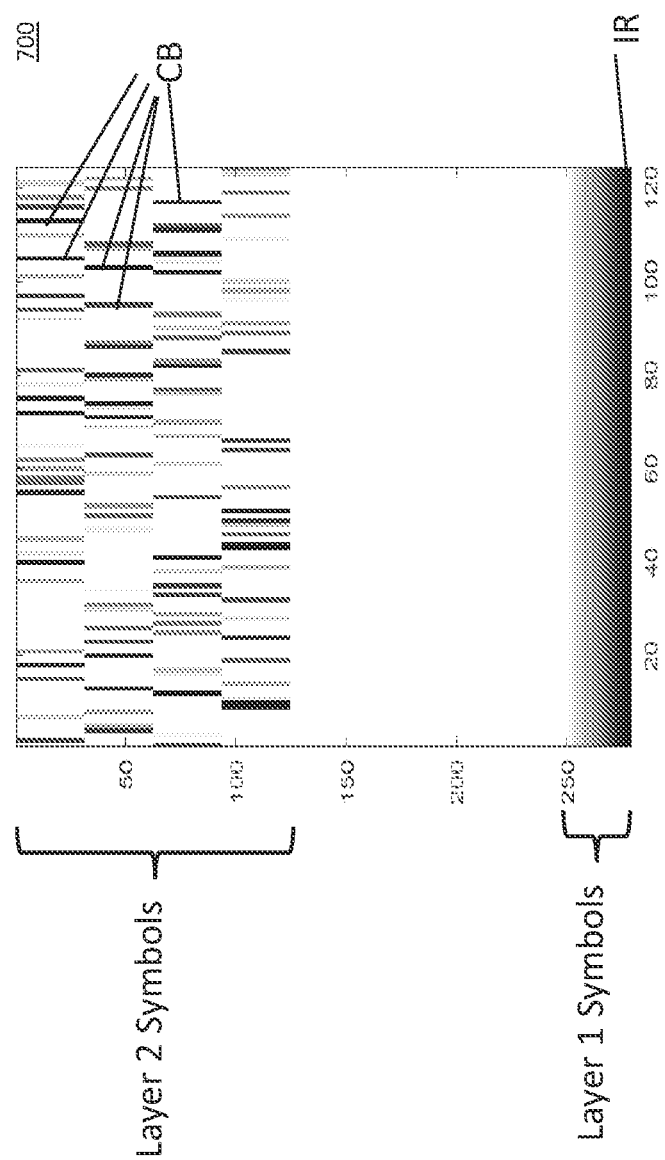

Example 2: Assume W=31, n=248, P=9, and Q=4, Table 1 below shows the position of Layer 2 symbols. Each row of Table 1 corresponds to one codeword i_cw=0, . . . , 30. Each entry includes a triple pair of numbers. The first two pairs are the row and column indices of a selected one of 31×31 blocks B in memory 700. The third entry is the column index within the selected block B. After the encoding of each codeword is completed, Layer 1 symbols and the associated parities or parity bits or symbols are stored into memory 700. Table 2 below lists the position of the Layer 1 symbols for each codeword. Each row of Table 2 corresponds to one codeword i_cw=0, . . . , 30. Each entry of Table 2 also include a triple pair of numbers. Here, the first two numbers in each entry point to the coordinates of the selected quadrant. The third one points to the index of the row within the selected quadrant. In this example, it is assumed that Layer 2 symbols are chosen from 4 consecutive row blocks of the memory structure. Since P=9, there are 4 row-blocks that constitute a gap between the Layer 1 and Layer 2 symbols. FIG. 9 illustrates a further example of memory 700 and the random arrangement of Layer 1 and Layer 2 symbols, consistent with the present disclosure. Codewords from 0 to 30 correspond to lines having different shades of gray. For example, Layer 2 bits are arranged in randomly distributed columns, some of which are labeled "CB" in FIG. 9. Such columns, as noted above are included in various blocks B of memory 700. Layer 1 bits, on the other hand, are provided in rows, such as row IR of memory 700. Such Layer 1 bits are fed to the encoder. Also, Layer 2 bits from randomly selected columns in randomly selected blocks are fed to the encoder, as well as input data bits, as discussed in greater detail below.

Table 1: Layer 2 symbols Table 2: Layer 1 symbols

| | Layer 2 symbols | | | |
|---|---|---|---|---|
| i_cw | 0 . . . 30 | 31 . . . 61 | 62 . . . 92 | 93 . . . 123 |
| 0 | [0, 2, 21] | [2, 1, 21] | [3, 0, 21] | [1, 3, 21] |
| 1 | [0, 1, 5] | [2, 3, 5] | [1, 2, 5] | [3, 0, 5] |
| 2 | [3, 3, 2] | [0, 2, 2] | [1, 1, 2] | [2, 0, 2] |
| 3 | [2, 0, 15] | [0, 2, 15] | [3, 3, 15] | [1, 1, 15] |
| 4 | [3, 0, 10] | [0, 1, 10] | [1, 2, 10] | [2, 3, 10] |
| 5 | [2, 1, 29] | [0, 2, 29] | [1, 0, 29] | [3, 3, 29] |
| 6 | [1, 2, 6] | [0, 0, 6] | [3, 3, 6] | [2, 1, 6] |
| 7 | [3, 0, 27] | [1, 1, 27] | [2, 2, 27] | [0, 3, 27] |
| 8 | [3, 1, 16] | [0, 3, 16] | [2, 0, 16] | [1, 2, 16] |
| 9 | [1, 3, 13] | [3, 0, 13] | [0, 1, 13] | [2, 2, 13] |
| 10 | [0, 3, 7] | [3, 1, 7] | [1, 0, 7] | [2, 2, 7] |
| 11 | [3, 3, 4] | [1, 0, 4] | [0, 1, 4] | [2, 2, 4] |
| 12 | [1, 3, 28] | [0, 1, 28] | [3, 2, 28] | [2, 0, 28] |
| 13 | [0, 0, 20] | [3, 3, 20] | [2, 2, 20] | [1, 1, 20] |
| 14 | [2, 0, 24] | [3, 1, 24] | [1, 2, 24] | [0, 3, 24] |
| 15 | [0, 1, 30] | [3, 3, 30] | [1, 0, 30] | [2, 2, 30] |
| 16 | [0, 1, 26] | [3, 2, 26] | [2, 0, 26] | [1, 3, 26] |
| 17 | [2, 2, 25] | [3, 3, 25] | [1, 0, 25] | [0, 1, 25] |
| 18 | [0, 2, 18] | [3, 0, 18] | [1, 1, 18] | [2, 3, 18] |
| 19 | [2, 2, 14] | [0, 0, 14] | [3, 1, 14] | [1, 3, 14] |
| 20 | [2, 0, 0] | [3, 1, 0] | [1, 2, 0] | [0, 3, 0] |
| 21 | [2, 1, 22] | [1, 0, 22] | [0, 3, 22] | [3, 2, 22] |
| 22 | [3, 2, 1] | [0, 0, 1] | [2, 1, 1] | [1, 3, 1] |
| 23 | [2, 1, 3] | [0, 3, 3] | [1, 0, 3] | [3, 2, 3] |
| 24 | [0, 0, 17] | [3, 1, 17] | [1, 2, 17] | [2, 3, 17] |
| 25 | [3, 0, 23] | [0, 1, 23] | [1, 2, 23] | [2, 3, 23] |
| 26 | [1, 0, 12] | [2, 3, 12] | [0, 2, 12] | [3, 1, 12] |
| 27 | [1, 2, 8] | [2, 3, 8] | [0, 1, 8] | [3, 0, 8] |
| 28 | [3, 1, 19] | [2, 2, 19] | [0, 3, 19] | [1, 0, 19] |
| 29 | [1, 3, 9] | [2, 1, 9] | [3, 0, 9] | [0, 2, 9] |
| 30 | [1, 2, 11] | [0, 3, 11] | [3, 1, 11] | [2, 0, 11] |

| | Layer 1 symbols | | | |
|---|---|---|---|---|
| i_cw | 124 . . . 154 | 155 . . . 185 | 186 . . . 216 | 217 . . . 247 |
| 0 | [8, 0, 0] | [8, 1, 0] | [8, 2, 0] | [8, 3, 0] |
| 1 | [8, 0, 1] | [8, 1, 1] | [8, 2, 1] | [8, 3, 1] |
| 2 | [8, 0, 2] | [8, 1, 2] | [8, 2, 2] | [8, 3, 2] |

| | | | | |
|---|---|---|---|---|
| 3 | [8, 0, 3] | [8, 1, 3] | [8, 2, 3] | [8, 3, 3] |
| 4 | [8, 0, 4] | [8, 1, 4] | [8, 2, 4] | [8, 3, 4] |
| 5 | [8, 0, 5] | [8, 1, 5] | [8, 2, 5] | [8, 3, 5] |
| 6 | [8, 0, 6] | [8, 1, 6] | [8, 2, 6] | [8, 3, 6] |
| 7 | [8, 0, 7] | [8, 1, 7] | [8, 2, 7] | [8, 3, 7] |
| 8 | [8, 0, 8] | [8, 1, 8] | [8, 2, 8] | [8, 3, 8] |
| 9 | [8, 0, 9] | [8, 1, 9] | [8, 2, 9] | [8, 3, 9] |
| 10 | [8, 0, 10] | [8, 1, 10] | [8, 2, 10] | [8, 3, 10] |
| 11 | [8, 0, 11] | [8, 1, 11] | [8, 2, 11] | [8, 3, 11] |
| 12 | [8, 0, 12] | [8, 1, 12] | [8, 2, 12] | [8, 3, 12] |
| 13 | [8, 0, 13] | [8, 1, 13] | [8, 2, 13] | [8, 3, 13] |
| 14 | [8, 0, 14] | [8, 1, 14] | [8, 2, 14] | [8, 3, 14] |
| 15 | [8, 0, 15] | [8, 1, 15] | [8, 2, 15] | [8, 3, 15] |
| 16 | [8, 0, 16] | [8, 1, 16] | [8, 2, 16] | [8, 3, 16] |
| 17 | [8, 0, 17] | [8, 1, 17] | [8, 2, 17] | [8, 3, 17] |
| 18 | [8, 0, 18] | [8, 1, 18] | [8, 2, 18] | [8, 3, 18] |
| 19 | [8, 0, 19] | [8, 1, 19] | [8, 2, 19] | [8, 3, 19] |
| 20 | [8, 0, 20] | [8, 1, 20] | [8, 2, 20] | [8, 3, 20] |
| 21 | [8, 0, 21] | [8, 1, 21] | [8, 2, 21] | [8, 3, 21] |
| 22 | [8, 0, 22] | [8, 1, 22] | [8, 2, 22] | [8, 3, 22] |
| 23 | [8, 0, 23] | [8, 1, 23] | [8, 2, 23] | [8, 3, 23] |
| 24 | [8, 0, 24] | [8, 1, 24] | [8, 2, 24] | [8, 3, 24] |
| 25 | [8, 0, 25] | [8, 1, 25] | [8, 2, 25] | [8, 3, 25] |
| 26 | [8, 0, 26] | [8, 1, 26] | [8, 2, 26] | [8, 3, 26] |
| 27 | [8, 0, 27] | [8, 1, 27] | [8, 2, 27] | [8, 3, 27] |
| 28 | [8, 0, 28] | [8, 1, 28] | [8, 2, 28] | [8, 3, 28] |
| 29 | [8, 0, 29] | [8, 1, 29] | [8, 2, 29] | [8, 3, 29] |
| 30 | [8, 0, 30] | [8, 1, 30] | [8, 2, 30] | [8, 3, 30] |

Operation of one FEC encoders 1002 consistent with the present disclosure will next be described with reference to FIG. 10. It is understood that each of the FEC encoders 1002 may have a similar structure as that shown in FIG. 10. In the example shown in FIG. 10, X2 bits are bits included in data stream D0 and input as new symbols to encoder 1022. In addition, encoder 1022 receives Layer 1 symbols from, for example, one of rows R1 to R4 of memory 700. The Layer 1 symbols include X data bits and associated P parity bits, which were generated during a previous clock cycle. The Layer 1 symbols, in this example, are stored in a respective one of rows R1 to R4, such that the entire row of bits is read out as some of read-out bits RB. In other words, the Layer 1 symbols are output row wise from memory 700.

Figure 10:
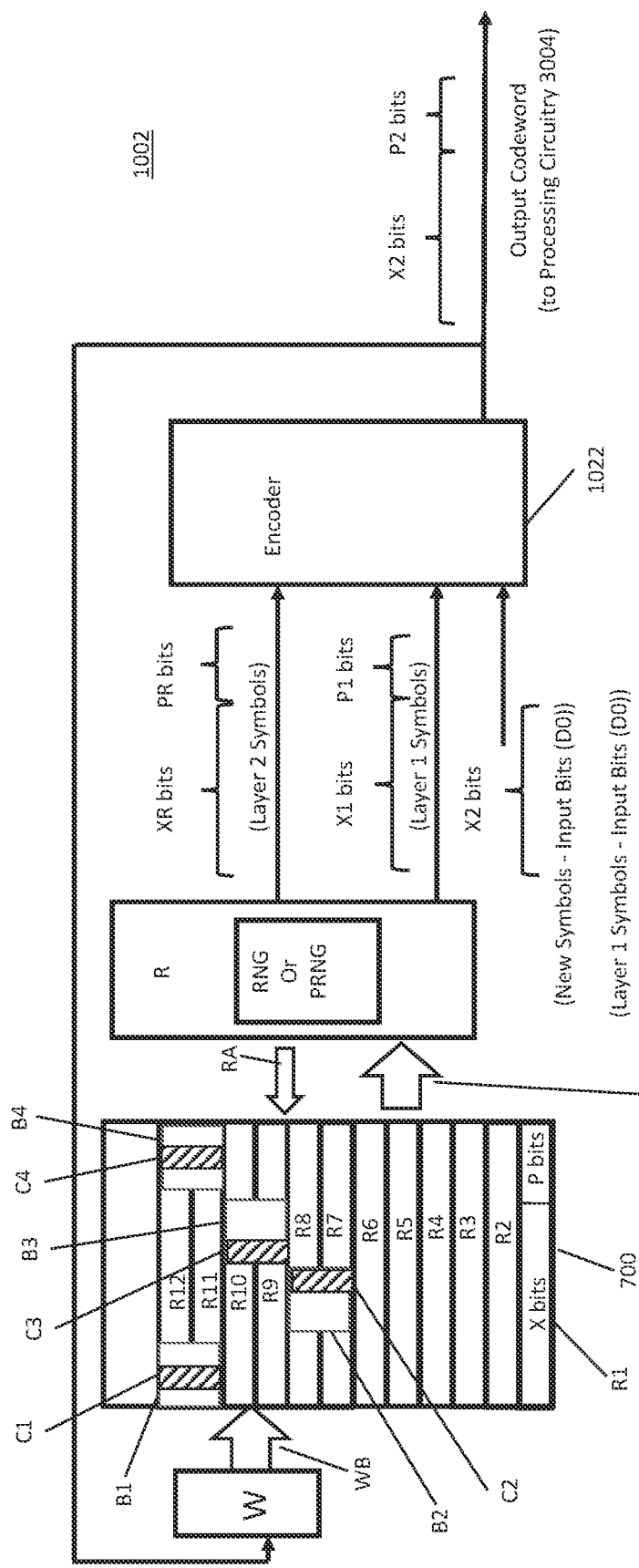
FIG. 10 shows an example of an FEC encoder consistent with a further aspect of the present disclosure.

As further shown in FIG. 10, Layer 2 symbols are also fed to encoder 1022. Layer 2 symbols include bits of randomly selected columns C of bits within randomly selected blocks B. In the example shown in FIG. 10, randomly selected columns of bits C1, C2, and C3 are provided from randomly selected blocks of bits B1, B2, and B3 respectively, as data bits XR, and randomly selected bits from column C4 from randomly selected block B4 are output as parity bits of the Layer 2 symbols. It is understood that more or fewer data bits and parity bits from more or fewer columns and blocks of memory 700 may be output as the Layer 1 and Layer 2 symbols.

Based on the Layer 1 symbols, the Layer 2 symbols, and the new symbols (X2 bits), new parity bits P2 are output from encoder along with the new symbols (X2 bits). Collectively, the X2 bits and P2 bits constitute a codeword that is provided to processing circuitry 3004 of FIG. 3.

As further shown in FIG. 10, successively generated codewords output from encoder 1022 are fed to a write circuit W, which supplies the codewords as write bits (WB) to a row of memory 700. In one example, an initial codeword may be written to row R1 in a first clock cycle, and in the next clock cycle, the next (or second) codeword output from encoder 1022 is written to row R1 and the initial codeword is shifted up in memory 700 and stored in row R2. A third codeword output from encoder 1022 is then written to row R1, the second codeword is shifted to row R2, and the initial codeword is shifted to row R3. Thus, as new codewords are added to row R1 of memory 700, previously stored codewords are shifted upward, row by row, in memory 700. Once a row of bits or codeword is shifted into row R5 and higher rows, such codeword may include bits that are randomly selected as part of the Layer 2 symbols that are output to encoder 1022, as noted above. Such selection may be carried out by a random number generator RNG circuit in read circuit R that provides randomly generated addresses RA in memory 700 for accessing bits of the Layer 2 symbols. Alternatively, a pseudo-random number generator circuit (PNRG) may be employed to select address of bits that constitute the Layer 2 symbols. The bits of the Layer 2 symbols may also constitute some of the bits RB read out from memory 700. In this example, since the Layer 2 symbols are output from columns of bits, the bits are considered to be output column-wise.

Although the bits of the Layer 2 symbols can be output from any location in memory 700 if the required conditions are held, there can be big differences in implementation complexity and power consumption between an arbitrary design and the one in which implementation aspects are considered. Memory 700 may be implemented using shift registers or random gates. However, specifically using shift registers or random gates for codes requiring multiple iterations in a decoder provided in a receiver may increase costs.

Alternatively, memory 700 may be implemented as Random Access Memories (RAM). In this case, if the Layer 1 and Layer 2 symbols are arranged such that with each access to memory 700 a group of symbols (not just one) is read or written from/to memory 700, the amount of consumed power may be reduced. This is because the power consumption of the RAM is directly related to the access rate to the RAM. It is also a function of the width of the symbols that are read/written to the RAM, but the access rate is the dominant factor in determining power consumption of the RAM.

In some instances, symbols stored in a two-dimensional RAM 700 are accessed row wise. For example, for a RAM 700 of size L×W symbols (see FIG. 7), only a few groups N of W symbols may be read or written at a time (per access to the memory) in the row direction. Accordingly, if W symbols in a column direction are desired, WIN separate accesses to the RAM are required to collect all the required symbols.

Figure 11:
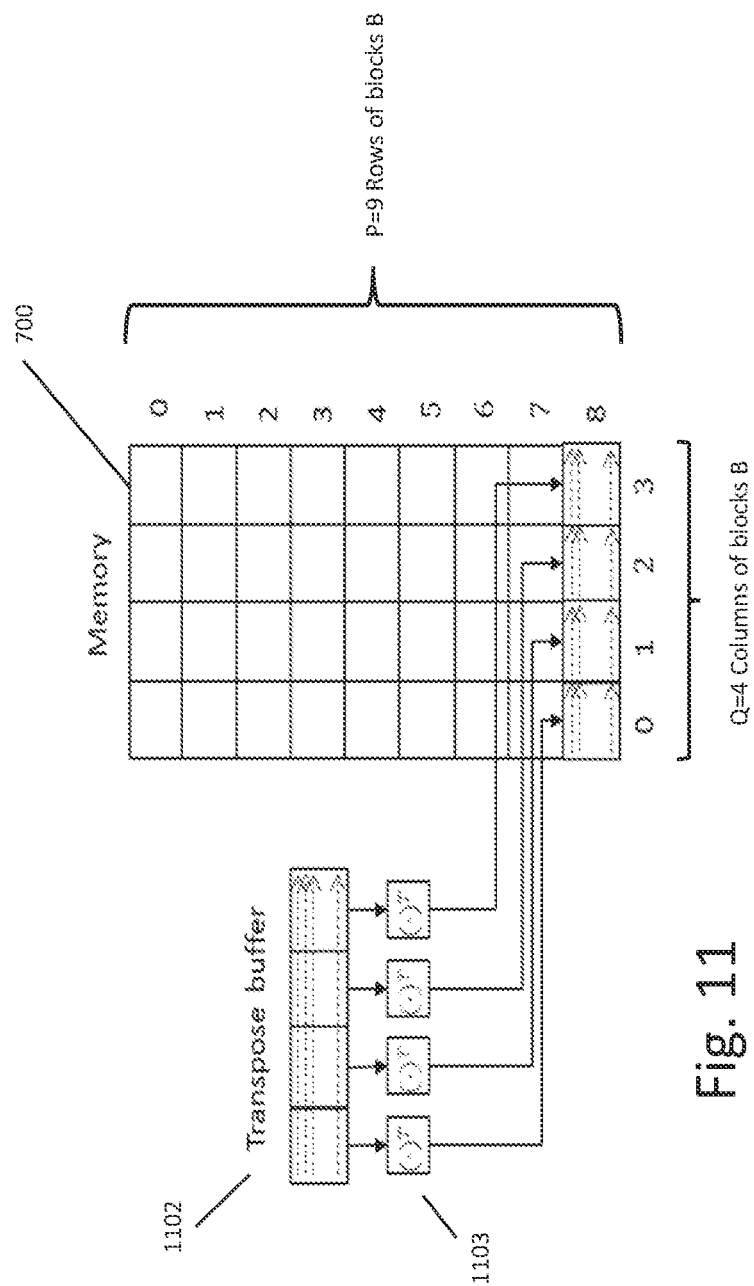
FIG. 11 shows an example of a memory and associated transpose circuitry consistent with an additional aspect of the present disclosure.

The Layer 2 symbols in memory 700 are often not stored in the same direction as Layer 1 symbols. If Layer 1 symbols are in a row direction, the Layer 2 symbols are stored in a column direction. This may be problematic in some instances, as WIN separate calls or accesses to the RAM may be required to collect every portion of Layer 2 symbols. Consistent with a further aspect of the present disclosure, however, the bits of the Layer 1 symbols are preferably written to the RAM 700 column wise. Thus, when the bits are called as Layer 2 symbols (after subsequent row shifts upward, as described above), each portion including W symbols is read from RAM 700 in one call. Accordingly, as shown in FIG. 11, transpose buffer circuit 1102 of size W×(N×W) is provided to first store the Layer 1 symbols received at the current clock cycle, and in each clock cycle transpose buffer circuit 1102 is written to in the row wise direction. Once buffer circuit 1102 is filled, the buffer circuit 1102 is read from in a column wise manner by transpose circuits 1103 and the (transposed) data or bits are output from circuits 1103 and written to RAM 700.

A standard metric to evaluate the performance of a forward error correction code is the net coding gain (NCG).

Assuming binary phase shift keying (BPSK) modulation over an additive white Gaussian noise channel, NCG measures the difference in required Eb/N0 between uncoded transmission and coded transmission using the designed code. For a code rate R, and the desired output BER $p_{out}$ on a binary symmetric channel with crossover probability $p_{in}$, the NCG in dB is defined as $$NCG = dB10((Q^{-1}(p\text{out}))^2) - dB10((Q^{-1}(p_{in}))^2) + dB10(R)$$

Where $$dB10(\cdot) = 10\log_{10}(\cdot), \text{ and } Q(x) = \frac{1}{\sqrt{2\pi}} \int_x^\infty e^{-\frac{x^2}{2}} dx.$$

For the specific code design represented in Example 2, W=31, L=279, n=248. The binary BCH code (255,239,5) is extended to (256,239,6) and is shortened to (248,231,6). The FEC rate is 0.8629, and the FEC overhead is 15.89%. For this FEC, NCGs of 10.5, 11, and 11.2 dB are achieved at output BER of 1e-15 when 1, 2, and 3 iterations of soft decoding is used, respectively. In each scenario, the output of the last soft decoder is passed through 4 iterations of hard decoder for cleaning the remainder of bits in error. The error floor performance is improved by identifying and removing the stopping sets or stall error patterns.

Any standard soft decoding technique for binary block codes can be deployed. The standard lookup table based hard decoding of two error correcting binary BCH codes may also be deployed, and the extended parity bit may be used to reduce the probability of mis-correction.

Other embodiments will be apparent to those skilled in the art from consideration of the specification. It is intended that the specification and examples be considered as exemplary only, with a true scope and spirit of the invention being indicated by the following claims.

What is claimed is:

1. A forward error correction encoder, comprising:
   a memory having a first portion and a second portion, the first portion of the memory being delineated to include a plurality of blocks, each of the plurality of blocks including a plurality of columns of first bits, and the second portion of the memory including a plurality of rows, each of the plurality of rows including second bits; and
   an encoder circuit operable to generate parity bits based on selected ones of the first bits, selected ones of the second bits, and input data bits provided to the encoder circuit,
   wherein the selected ones of the first bits are stored in randomly selected ones of the plurality of columns, the randomly selected one of the plurality of columns being within randomly selected ones of the plurality of blocks.

2. A forward error correction encoder in accordance with claim 1, further including a random number generator that provides addresses associated with the randomly selected ones of the plurality of columns and the randomly selected ones of the plurality of blocks.

3. A forward error correction encoder in accordance with claim 1, further including a pseudo random number generator that provides addresses associated with the randomly selected ones of the plurality of columns and the randomly selected ones of the plurality of blocks.

4. A forward error correction encoder in accordance with claim 1, wherein the encoder generates the parity bits based on a generalized convolutional product code (GCPC).

5. A forward error correction encoder in accordance with claim 1, further including:
   a buffer that stores the second bits and supplies the second bits to a plurality of transpose circuits, the plurality of transpose circuits supplying the second bits to the memory.

6. A forward error correction encoder in accordance with claim 1, wherein the memory includes a random access memory (RAM).

7. A forward error correction encoder in accordance with claim 1, wherein the input data bits and parity bits are stored in the memory.

* * * * *